(12) United States Patent
Cao et al.

(10) Patent No.: US 11,333,744 B2
(45) Date of Patent: May 17, 2022

(54) MODIFIED LIDAR HOUSING

(71) Applicant: Faraday&Future Inc., Gardena, CA (US)

(72) Inventors: Chi Hung Cao, Huntington Beach, CA (US); Myong H. Kim, Tustin, CA (US)

(73) Assignee: Faraday&Future Inc., Gardena, CA (US)

( * ) Notice: Subject to any disclaimer, the term of this patent is extended or adjusted under 35 U.S.C. 154(b) by 0 days.

(21) Appl. No.: 15/970,793

(22) Filed: May 3, 2018

(65) Prior Publication Data

US 2019/0129010 A1 May 2, 2019

Related U.S. Application Data

(60) Provisional application No. 62/501,672, filed on May 4, 2017.

(51) Int. Cl.
*G01S 7/481* (2006.01)
*H05K 5/02* (2006.01)
*B60R 11/00* (2006.01)
*G01S 17/931* (2020.01)

(52) U.S. Cl.
CPC ............ *G01S 7/4813* (2013.01); *B60R 11/00* (2013.01); *G01S 17/931* (2020.01); *H05K 5/0247* (2013.01); *B60R 2011/0049* (2013.01)

(58) Field of Classification Search
CPC ..... G01S 7/4831; G01S 17/931; B60R 11/00; H05K 5/0247
USPC .................................. 73/431, 432.1
See application file for complete search history.

(56) References Cited

U.S. PATENT DOCUMENTS

| | | | | |
|---|---|---|---|---|
| 3,707,697 A | * | 12/1972 | Izumi | H01R 31/02 439/107 |
| 8,675,181 B2 | * | 3/2014 | Hall | G01C 3/08 356/5.01 |
| 2015/0355333 A1 | * | 12/2015 | Ono | G01S 7/4972 356/4.01 |
| 2016/0223663 A1 | * | 8/2016 | Schmalenberg | G01S 13/931 |

(Continued)

FOREIGN PATENT DOCUMENTS

WO    WO-2012168292 A2 * 12/2012 ........... G02B 6/4471

OTHER PUBLICATIONS

"Detecting and Ranging Solutions", Sick sensor intelligence. Oct. 18, 2018 https://cdn.sick.com/media/docs/0/30/930/Product_segment_overview_Detection_and_Ranging_Solutions_2D_laser_scanners_3D_laser_scanners_radar_sensors_en_IM0063930.PDF) pp. 1-16. accessed Jan. 31, 2020.*

(Continued)

*Primary Examiner* — Nimeshkumar D Patel
*Assistant Examiner* — Jean F Morello
(74) *Attorney, Agent, or Firm* — Veros Legal Solutions, LLP

(57) ABSTRACT

Housing for vehicle sensors (e.g., Lidar sensors) can include an adapter bracket configured to route a cable either out of the side of the sensor housing or out of the bottom of the sensor housing. In some examples, different adapter brackets can be used to run the cable in different configurations, while in other examples, a single adapter bracket can run a cable in both side-exit and bottom-exit configurations. An adapter bracket can include a breathable mesh portion configured to allow air to pass through the mesh, while blocking moisture.

19 Claims, 7 Drawing Sheets

(56) References Cited

U.S. PATENT DOCUMENTS

2016/0291134 A1* 10/2016 Droz ................. G01S 17/87
2018/0052236 A1* 2/2018 Hoffman, Jr ............ B60R 11/00

OTHER PUBLICATIONS

"VLP-16 User Manual" Velodyne LiDAR. (htttps://velodynelidar.com/products/puck) pp. 1-140 accessed Jan. 31, 2020.*
Ouster.com website print, (www.ouster.com) accessed Jan. 31, 2020.*

* cited by examiner

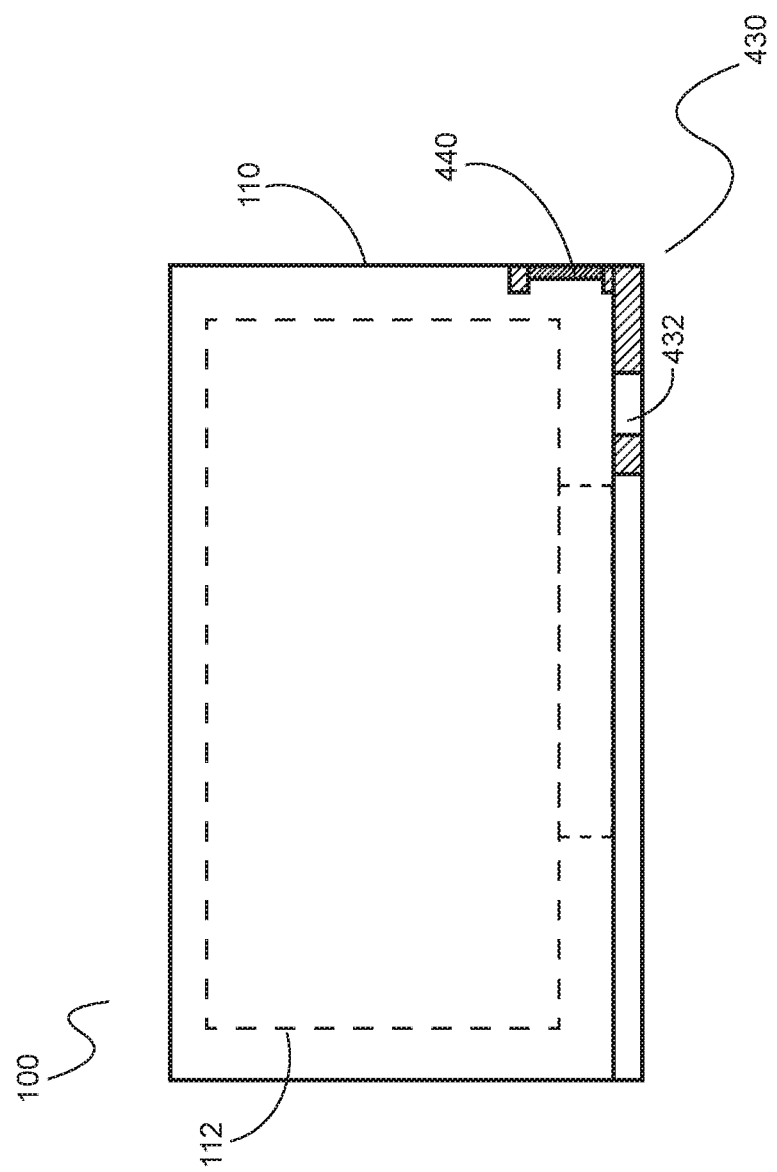

MODIFIED LIDAR HOUSING

CROSS-REFERENCE TO RELATED APPLICATIONS

This application claims the benefit of U.S. Provisional Application No. 62/501,672 filed on May 4, 2017, the entirety of which is hereby incorporated by reference.

FIELD OF THE DISCLOSURE

This relates generally to a housing for a Lidar system, and more specifically, for a housing which includes an adapter bracket configured to route a cable through the bottom of the housing.

BACKGROUND OF THE INVENTION

Sensors are becoming more widely and prevalently used in vehicles, such as automobiles, for various purposes including navigation, providing driving aids, and for partial or full autonomous driving systems. The housing for these sensors can be pre-assembled before they are installed on the vehicle. However, some vehicles may require wiring for the sensor to be routed through the bottom of the housing, while others may require wiring to be routed through the side of the housing. In addition, in some cases, the sensor housing can be susceptible to condensation when the temperature within the housing is elevated.

SUMMARY OF THE DISCLOSURE

Housing for vehicle sensors (e.g., Lidar sensors) can include an adapter bracket configured to route a cable either out of the side of the sensor housing (e.g., through a wall of the sensor housing) or out of the bottom of the sensor housing (e.g., through a base of the sensor housing). In some examples, different adapter brackets can be used to run the cable in different configurations such as side-exit and bottom-exit configurations. In other examples, a single adapter bracket can run a cable in both side-exit and bottom-exit configurations depending on the orientation of the bracket as it is installed on the sensor housing. In some examples, an adapter bracket can include a breathable mesh portion configured to allow air to pass through the mesh, while blocking moisture.

BRIEF DESCRIPTION OF THE DRAWINGS

FIG. 5 illustrates a cross-sectional front view of a sensor housing including the example adapter bracket shown in FIG. 4 according to examples of the disclosure.

FIGS. 6A-6C illustrate perspective views of a sensor housing according to examples of the disclosure, wherein FIG. 6A illustrates the sensor housing without an adapter bracket, FIG. 6B illustrates the sensor housing with an example adapter bracket in a first orientation, and FIG. 6C illustrates the sensor housing with the example adapter bracket shown in a second orientation.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Sensor systems for detecting stimuli external to a vehicle are becoming increasingly useful for automobiles and other vehicles as the vehicles are becoming increasingly outfitted with driving aids and autonomous driving systems. Example sensors include Lidar (which stands for Light Detection And Ranging), ultrasonic, imaging cameras, radio transducer(s), other wave detecting sensors, or a combination of the preceding. The sensors can be used to obtain environmental information from outside of a vehicle to aid in navigation of the vehicle. For example, the sensors can be used to image and characterize a roadway, obstacles, pedestrians, other vehicles, or other such information that can be used for navigation of a vehicle. The sensors can be used with a Heads Up Display (HUD) or other such displays to provide enhanced situational awareness to a vehicle operator. The sensors can be used to provide information to partial or full autonomous driving systems of a vehicle to enable the vehicle to partially or fully operate without direct user commands.

This disclosure relates to sensor housings (e.g., housings for Lidar sensors), and adapter brackets for sensor housings. Because different vehicles have different designs, it can be beneficial to customize certain features of the sensor housing, for example, the exit location of the sensor wiring on the sensor housing. However, in some cases, it can be uneconomical or inefficient to produce multiple sensor housings for multiple applications. In some cases, the conventional housing for sensors can be pre-assembled before they are installed on a vehicle, thus imposing design constraints on the vehicle in order to be compatible with the pre-assembled sensor housing.

For example, some vehicles may require wiring for the sensor to be routed through the bottom of the housing, while others may require wiring to be routed through the side of the housing. In addition, in some cases, the sensor housing can be susceptible to condensation when the temperature within the housing is elevated. The examples discussed herein address these issues.

Figure 1A:
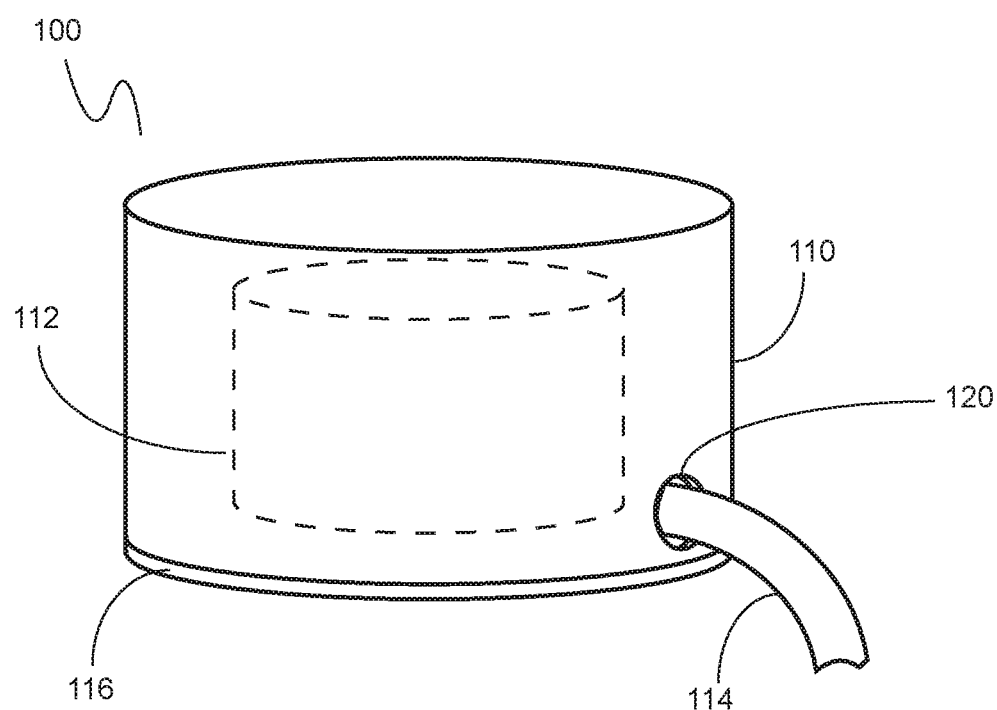
FIGS. 1A and 1B illustrate a front perspective and bottom view, respectively, of a conventional sensor housing according to examples of the disclosure.
Figure 1B:
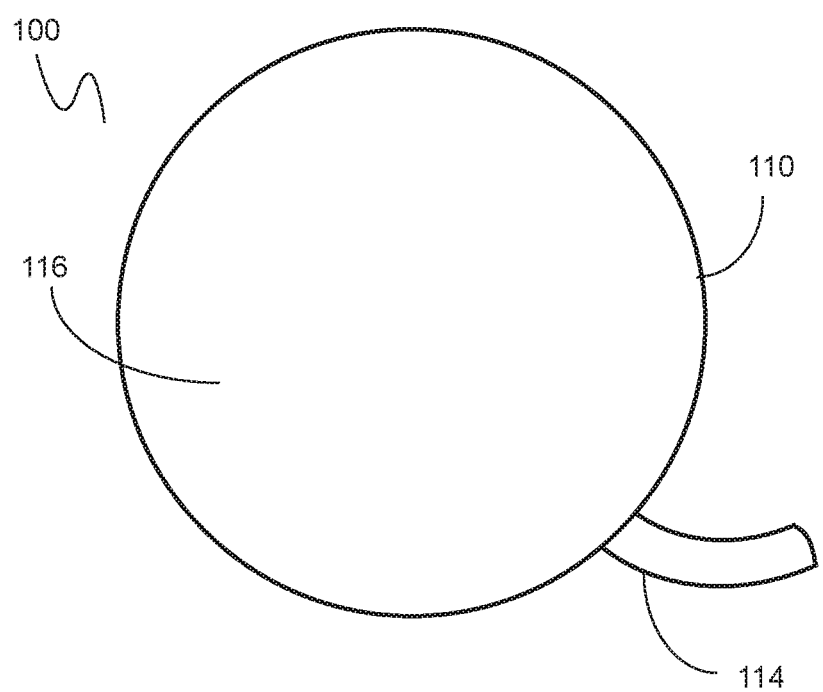

FIGS. 1A and 1B illustrate a front perspective and bottom view, respectively, of a conventional sensor housing 100 according to examples of the disclosure. As shown, the sensor housing 100 can include a housing wall 110 which surrounds the sensor itself 112. A cable 114 (or a plurality of cables) can be coupled to the sensor 112 and extend through a hole 120 in the side of the housing, while a base of the housing 116 can be intact. As discussed, in some examples, it can be desirable to run the cable through the bottom of the housing (e.g., through the base 116), however, in cases where sensor housings are pre-assembled, this may require multiple versions of sensor housings to be pre-assembled (e.g., one version of a pre-assembled housing having a side-exit cable configuration, another version with a bottom-exit cable configuration).

Figure 2A:
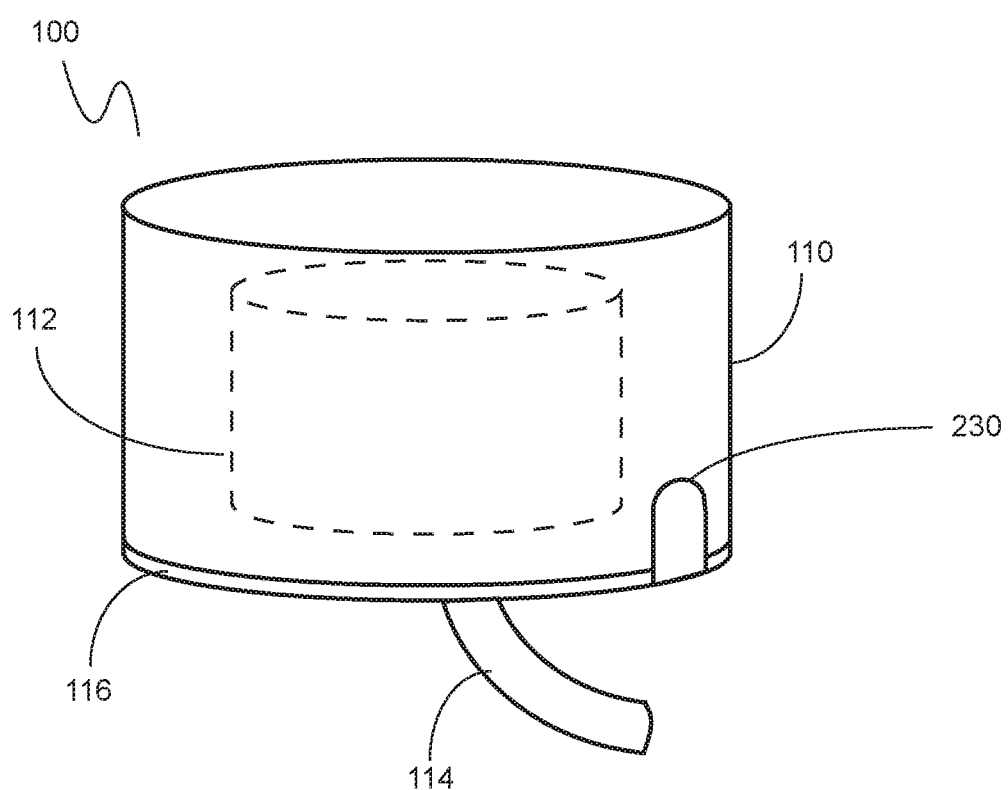
FIGS. 2A and 2B illustrate a front perspective and bottom view, respectively, of a sensor housing with an example adapter bracket according to examples of the disclosure.
Figure 2B:
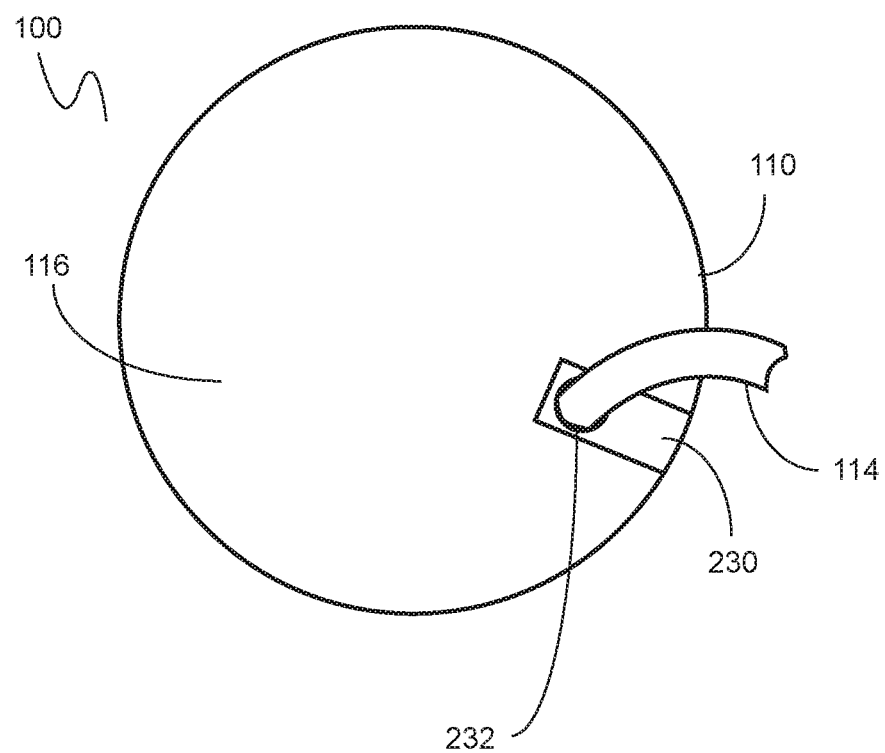

FIGS. 2A and 2B illustrate a front perspective and bottom view, respectively, of a sensor housing 100 with an example adapter bracket 230 according to examples of the disclosure. As will be explained, in some examples, the sensor housing can be preassembled and configured to accept an adapter bracket 230, which can route cable 114 through the bottom of the housing 100 (e.g., through the base 116).

Figure 3A:
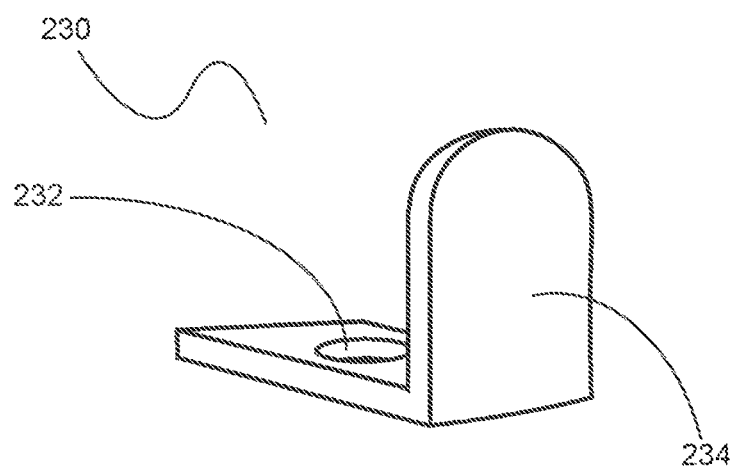
FIG. 3A illustrates a perspective view of the example adapter bracket shown in FIGS. 2A and 2B according to examples of the disclosure.
Figure 3B:
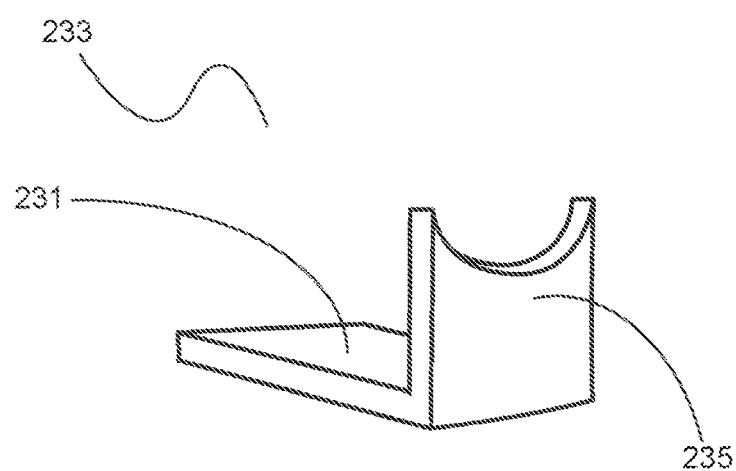
FIG. 3B illustrates an alternative example adapter bracket according to examples of the disclosure.

FIG. 3A illustrates a perspective view of the example adapter bracket 230 shown in FIGS. 2A and 2B according to examples of the disclosure, and FIG. 3B illustrates an alternative example adapter bracket 233 according to examples of the disclosure. Adapter bracket 230 shown in FIG. 3A can include a first portion 234 which includes a semicircular end, and a second portion including a hole 232. In some cases, adapter bracket 230 can be bent approximately 90 degrees such the first portion 234 and hole 232 are each on perpendicular surfaces. As illustrated in FIGS. 2A-2B, the semicircular portion 234 can be of a radius substantially the same as the radius of hole 120 shown in FIG. 1A. In some examples, a preassembled conventional sensor housing (e.g., housing 100 shown in FIG. 1A) can be modified by cutting a channel having a width equal to the diameter of hole 120, which runs downward from hole 120, continuing around the bottom edge and into sensor base 116. In this way, adapter bracket 230 can be configured to fit the channel, thereby moving the wiring from a side exit configuration to a bottom-exit configuration.

It should be understood that in some cases, the sensor housing can be preassembled with this channel pre-cut, which can give a user the option to choose whether cable 114 exits from the side or bottom of the sensor housing. FIG. 3B illustrates another adapter bracket 233 which is configured to run the cable out of the side of the sensor housing. In the example shown, bracket 233 can have a first end 235, which has a semicircle cutout. The semicircle cutout in the first end 235 can have a radius substantially equal to that of hole 120. Adapter bracket 233 can have a second portion 231, which does not include a hole. As with the bracket discussed with relation to FIG. 3A, adapter bracket 233 can be configured to fit into a channel. Thus, by choosing either bracket 230 or bracket 233, a user can choose whether the housing has a side-exit cable configuration or a bottom-exit cable configuration.

Figure 4:
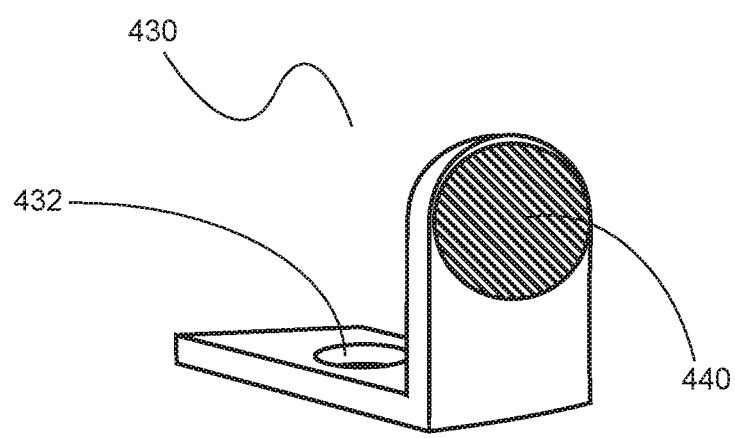
FIG. 4 illustrates a perspective view of another example adapter bracket, which includes a breathable mesh portion according to examples of the disclosure.

In some examples, it can be beneficial to manage the air pressure within housing 100 (e.g., in order to reduce condensation on housing wall 110). FIG. 4 illustrates a perspective view of another example adapter bracket 430, which includes a breathable mesh portion 440 according to examples of the disclosure. As shown, bracket 430 can be similar to bracket 230 discussed with reference to FIG. 3A above, however, bracket 430 can include a breathable mesh portion 440 configured to approximately fit within the location of hole 120. Breathable mesh portion 440 can be made, for example, of a material that is penetrable to air, but impenetrable to moisture. Thus, when adapter bracket 430 is used in conjunction with sensor housing 100, mesh portion 440 can allow heat and air pressure to vent from sensor housing, thus reducing heat and condensation. As with adapter bracket 230, bracket 430 can include a second end which includes a hole 432 configured to route cable 114 out of the bottom of the housing (e.g., through base 116). Breathable mesh portion 440 may be of a semicircular shape having the same radius as that of hole 120, or may be configured to fit a smaller hole cut into the bracket. Further, in some examples, breathable mesh portion 440 can be located anywhere on adapter bracket 430.

FIG. 5 illustrates a cross-sectional front view of a sensor housing including the example adapter bracket shown in FIG. 4 according to examples of the disclosure. As shown, air can enter and exit the sensor housing 100 through the mesh portion 440 of adapter bracket 430.

Figure 6A:
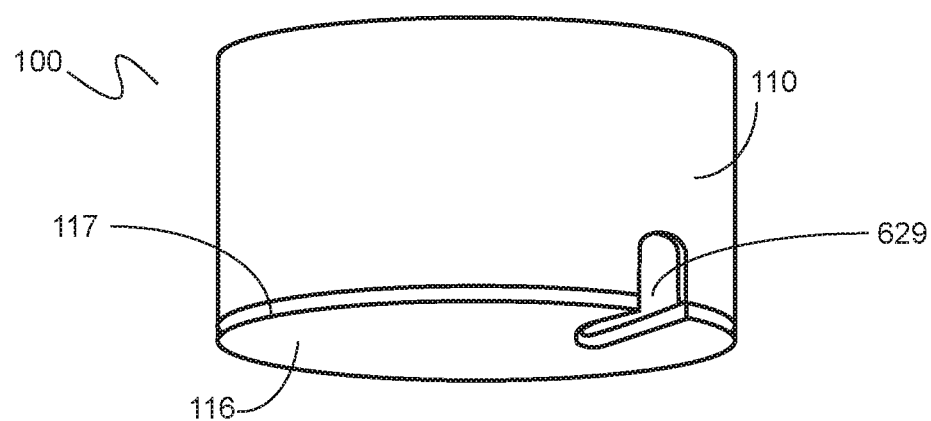
Figure 6B:
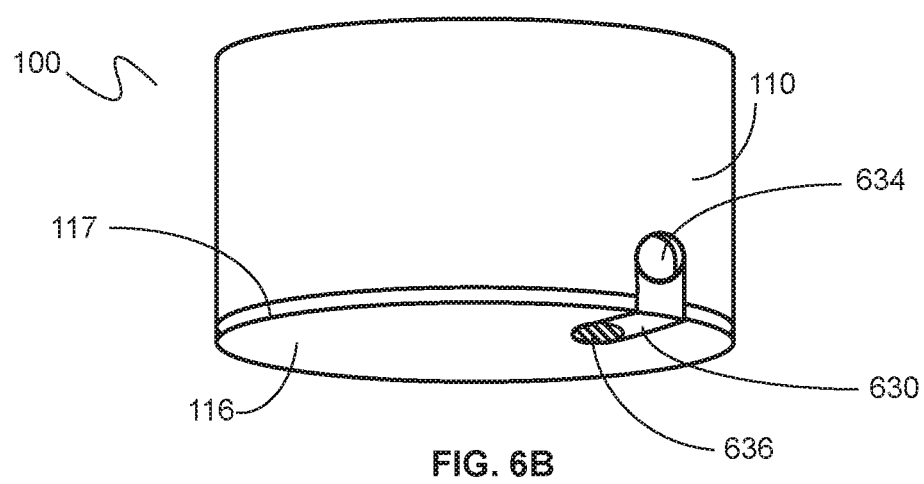
Figure 6C:
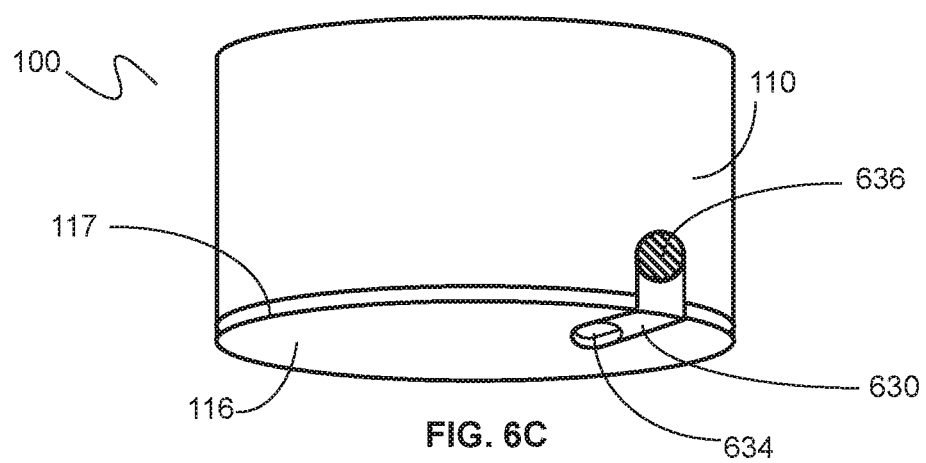

In some examples, a single adapter bracket can be configured to allow either side-exit or bottom-exit cable configurations depending on the orientation of the bracket when installed. FIGS. 6A-6C illustrate perspective views of a sensor housing 100 according to examples of the disclosure, with some components (e.g., cable 114) omitted for clarity. FIG. 6A illustrates the sensor housing without an adapter bracket, FIG. 6B illustrates the sensor housing with an example adapter bracket 630 in a first orientation, and FIG. 6C illustrates the sensor housing with the example adapter bracket 630 shown in a second orientation. As shown in FIG. 6A (and a similarly discussed with reference to FIGS. 2A-2B), in some examples, housing 100 can include a channel 629 running from a first position on a side of the housing (e.g., where hole 120 would reside in a conventional housing) to a second position on the bottom of the housing (e.g., where hole 232 would reside in a housing including bracket 230 discussed with reference to FIGS. 2A-2B). In some examples, both ends of channel 629 can be configured to have a semicircular shape of the same radius. Additionally, the length of the channel portion along the hosing wall 110 can be equal to the length of the channel portion along the bottom of the housing such that the full length of the channel 629 is centered about the bottom edge 117 of the housing.

Figure 7:
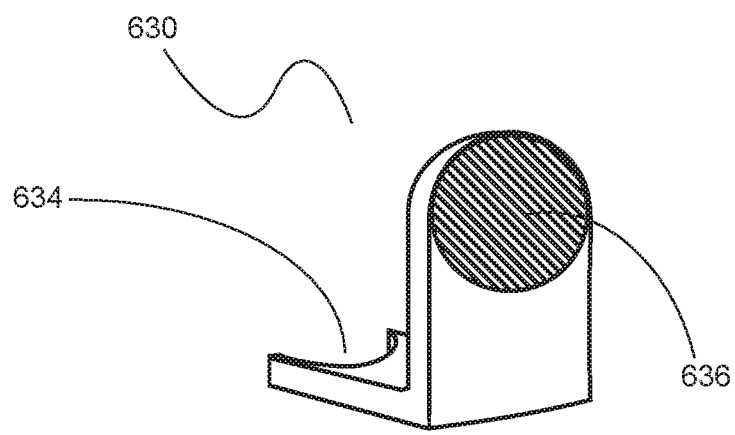
FIG. 7 illustrates a perspective view of the example adapter bracket shown in FIGS. 6B and 6C, which includes a breathable mesh portion according to examples of the disclosure.

FIG. 7 illustrates the adapter bracket 630 which can be installed in sensor housing 100 in two different orientations. As shown, a first end of bracket 630 can include a breathable mesh portion 636 having a semicircular end. A second end of bracket 634 can have a semicircle cutout with approximately the same radius as the semicircular end. A bend in bracket 630 (e.g., a right-angle or 90-degree bend) can be formed such that the surface of first end 636 and the surface of second end 634 are at a non-zero angle to one another. The distance from the radial center of the semicircle cutout portion 634 to the bend can be the same as the distance from the radial center of the semicircular portion 636 to the bend.

Returning to FIGS. 6B-6C, sensor 100 is illustrated in FIG. 6B with adapter bracket 630 configured to fit into channel 629 in a first orientation. When bracket 630 is installed as shown in FIG. 6B, cable 114 is configured to exit a hole 634 formed by the housing wall 110 and the semicircle cutout portion of the adapter bracket 230. Conversely, FIG. 6C illustrates sensor 100 having adapter bracket 630 configured to fit into channel 629 in a second orientation, the second orientation being 180 degrees rotated from the first orientation. When bracket 630 is installed as shown in FIG. 6C, cable 114 is configured to exit a hole 634 formed between the base 116 of the housing and the semicircle cutout portion of adapter bracket 230. Thus, by choosing either the first orientation of bracket 230 shown in FIG. 6B, or the second orientation of bracket 230 shown in FIG. 6C, the user can choose whether to have the cable exit the housing in a side-exit configuration or a bottom-exit configuration. Though not shown, it should be understood that in some examples, bracket 230 may not include a breathable mesh portion at first end 636, but instead may be a solid surface.

The various adapter brackets discussed above with reference to FIGS. 2-7 can be installed in sensor housing 100 using any appropriate fastening technique, including, without limitation, adhesives or mechanical fasteners (including brackets which snap into place). Similarly, the adapter bracket can be formed of any suitable material and may include further components not shown, including gaskets, sealants, O-rings, and the like. Moreover, though specific examples are shown above, it should be understood that various modifications to shape or scale are contemplated and within the scope of this disclosure. Generally, although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A bracket configured to fit a sensor housing, comprising:
   a first surface, including: a first end portion having a semicircular shape of a first diameter, a first inward portion extending from the first end portion having a width equal to the first diameter;
   a second surface, including: a second end portion including a semicircular cutout having the first diameter a second inward portion extending from the second end portion; and
   a bend portion of a non-zero angle connecting the first inward portion of the first surface to the second inward portion of the second surface;
   wherein the bracket is configured to be positioned in a first orientation and a second orientation on the sensor housing, each of the first and second orientation allowing a cable to exit a different surface of the sensor housing.

2. The bracket of claim 1, wherein the first surface is formed, at least in part, of a breathable mesh material configured to pass air through the mesh material and block water from penetrating the mesh material.

3. The bracket of claim 1, wherein the second inward portion extending from the second end portion has a width equal to the first diameter.

4. The bracket of claim 3, wherein a first distance from a first radius of the semicircular shape to the bend portion is the same as a second distance from a second radius of the semicircular cutout to the bend portion.

5. The bracket of claim 3, wherein the second surface ends at the semicircular cutout.

6. The bracket of claim 1, wherein the second surface extends beyond the semicircular cutout such that the semicircular cutout forms an aperture including the semicircular cutout.

7. The bracket of claim 6, wherein the aperture is circular and includes the semicircular cutout.

8. The bracket of claim 1, wherein the non-zero angle is 90 degrees.

9. A housing for a sensor comprising:
   a base supporting the sensor;
   a wall surrounding the sensor;
   an edge connecting the base and the wall;
   a channel extending from the base, around the edge, to the wall;
   a bracket configured to fit in the channel, the bracket including:
      a first surface, including: a first end portion having a semicircular shape of a first diameter, a first inward portion extending from the first end portion having a width equal to the first diameter;
      a second surface, including: a second end portion including a semicircular cutout having the first diameter a second inward portion extending from the second end portion;
      a bend portion of a non-zero angle connecting the first inward portion of the first surface to the second inward portion of the second surface;
      wherein the bracket is configured to be positioned in a first orientation and a second orientation on the housing, each of the first and second orientation allowing a cable to exit either the base or the wall of the housing, respectively.

10. The housing of claim 9, wherein the channel comprises a first end having a same shape as the semicircular shape of the first end portion of the bracket.

11. The housing of claim 10, wherein the channel comprises a second end having a same shape as the first end such that the channel is symmetric about the edge connecting the base and the wall.

12. The housing of claim 11, wherein: in the first orientation, the first surface of the bracket is aligned with the wall of the housing and the second surface of the bracket with the base of the housing, and in the second orientation, the first surface of the bracket is aligned with the base of the housing and the first surface with the wall of the housing.

13. The housing of claim 9, wherein the first surface of the bracket is formed, at least in part, of a breathable mesh material configured to pass air through the mesh material and block water from penetrating the mesh material.

14. The housing of claim 9, wherein the second inward portion of the bracket extending from the second end portion has a width equal to the first diameter.

15. The housing of claim 14, wherein a first distance from a first radius of the semicircular shape of the bracket to the bend portion of the bracket is the same as a second distance from a second radius of the semicircular cutout of the bracket to the bend portion of the bracket.

16. The housing of claim 14, wherein the second surface of the bracket ends at the semicircular cutout.

17. The housing of claim 9, wherein the second surface of the bracket extends beyond the semicircular cutout of the bracket such that the semicircular cutout forms an aperture on the bracket including the semicircular cutout.

18. The housing of claim 17, wherein the aperture on the bracket is circular and includes the semicircular cutout.

19. The housing of claim 9, wherein the sensor is a Lidar sensor.

* * * * *